(12) United States Patent
Hakey et al.

(10) Patent No.: US 7,088,422 B2
(45) Date of Patent: Aug. 8, 2006

(54) MOVING LENS FOR IMMERSION OPTICAL LITHOGRAPHY

(75) Inventors: Mark Charles Hakey, Fairfax, VT (US); David Vaclav Horak, Essex Junction, VT (US); Charles William Koburger, III, Delmar, NY (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 10/749,638

(22) Filed: Dec. 31, 2003

(65) Prior Publication Data

US 2005/0145803 A1    Jul. 7, 2005

(51) Int. Cl.
*G03B 27/42*    (2006.01)
*G03B 27/52*    (2006.01)
*G01J 1/00*    (2006.01)
*G03B 27/32*    (2006.01)

(52) U.S. Cl. ............................. 355/30; 355/53; 355/77; 250/491.1

(58) Field of Classification Search ................. 355/53, 355/30; 250/491.1
See application file for complete search history.

(56) References Cited

U.S. PATENT DOCUMENTS

| | | | | |
|---|---|---|---|---|
| 4,907,021 A | * | 3/1990 | Yabu | 353/101 |
| 4,978,212 A | * | 12/1990 | Hazard | 351/212 |
| 5,825,043 A | * | 10/1998 | Suwa | 250/548 |
| 5,900,354 A | * | 5/1999 | Batchelder | 430/395 |
| 6,191,889 B1 | * | 2/2001 | Maruyama | 359/566 |
| 2002/0019136 A1 | * | 2/2002 | Suzuki | 438/694 |
| 2002/0044260 A1 | * | 4/2002 | Takahashi et al. | 353/31 |
| 2002/0080226 A1 | * | 6/2002 | Johnson | 347/233 |
| 2004/0109237 A1 | * | 6/2004 | Epple et al. | 359/649 |
| 2005/0100745 A1 | * | 5/2005 | Lin et al. | 428/446 |

* cited by examiner

*Primary Examiner*—Rodney Fuller
*Assistant Examiner*—Kevin Gutierrez
(74) *Attorney, Agent, or Firm*—Robert R. Williams (57) ABSTRACT

An apparatus for immersion optical lithography having a lens capable of relative movement in synchrony with a horizontal motion of a semiconductor wafer in a liquid environment where the synchronous motion of the lens apparatus and semiconductor wafer advantageously reduces the turbulence and air bubbles associated with a liquid environment. The relative motions of the lens and semiconductor wafer are substantially the same as the scanning process occurs resulting in optimal image resolution with minimal air bubbles, turbulence, and disruption of the liquid environment.

16 Claims, 9 Drawing Sheets

| Angle | r2 (cm) | c2 (cm) | cos(theta) | sin(theta)^2 | h (cm) |
|---|---|---|---|---|---|
| -30 | 2 | 1.5 | 0.8660254 | 0.25 | 0.555 |
| -20 | 2 | 1.5 | 0.9396926 | 0.1169778 | 0.524 |
| -10 | 2 | 1.5 | 0.9848078 | 0.0301537 | 0.506 |
| 0 | 2 | 1.5 | 1 | 0 | 0.5 |
| 10 | 2 | 1.5 | 0.9848078 | 0.0301537 | 0.506 |
| 20 | 2 | 1.5 | 0.9396926 | 0.1169778 | 0.524 |
| 30 | 2 | 1.5 | 0.8660254 | 0.25 | 0.555 |

FIG. 7

MOVING LENS FOR IMMERSION OPTICAL LITHOGRAPHY

BACKGROUND OF THE INVENTION

1. Field of the Invention

The current invention generally relates to optical lithography, and more specifically relates to optical lithography implemented in an immersion liquid environment.

2. Description of the Related Art

The widespread utilization of computer systems to solve complex problems has created a demand for applications designed to produce solutions using increasingly complex algorithms. As the complexity of the problems has increased, so too have the computational requirements of the applications used to solve these problems. The ability of computer systems to produce accurate results in an efficient manner is determined by both the application design and computer system hardware running the application.

Increases in computer hardware performance are continuously strained by design specifications that push the physical properties of the materials that comprise a computer chip. Increased demands in performance require computer chips with more wires on more layers to perform complex computations in acceptable time frames. The number of components and wires on a computer chip required to satisfy these demands has continually increased forcing computer chip designers to create denser chip layouts or increase the physical dimensions of the chip. Chip manufacturers have chosen to keep chip size relatively constant over time and increase the density of components on chips.

As wire, component, and layer density increased on computer chips, manufacturers struggled to maintain the necessary precision for useful operation. To meet increasingly demanding precision requirements, the method of optical lithography was implemented using light to print device and wire patterns on the chip layers. Optical lithography uses a light projection device including a lens system to concentrate light of a particular wavelength onto a wafer. The wafer is first coated with a resist material sensitive to light exposure. As the light scans the wafer, the image is printed onto the wafer. Alternatively, "scanning" may be referred to as "imaging" and used interchangeably within the field of optical lithography. The wafer is then chemically bathed removing any positive acting photoresist material exposed to the light scan. In the early 1990's, optical lithography was capable of producing linewidths of 0.35 micrometers in manufacturing, and current optical lithography techniques can produce linewidths of 100 to 150 nanometers in manufacturing. Smaller lines can be produced for developmental and prototype purposes.

The foundation of optical lithography is based heavily on Rayleigh's two equations. These equations define the dependency of resolution (W) and depth of focus (DOF) on wavelength and the numerical aperture (NA) of the imaging system where numerical aperture is defined as a measure of light gathering power of a lens {Lin, B. J. "New $\lambda$/NA scaling equations for resolution and depth-of-focus." Optical Microlithography XIII (2000): 759.}. The resolution of imaging is defined in the Rayleigh equation: $W=k_1 \cdot \lambda_v/NA$. Resolution is the minimum feature that may be printed using optical lithography and determines the fidelity of the pattern transfer. Depth of focus can be defined as the region around the image plane in which the image will appear to be sharp. ("Depth of field and depth of focus", 25 Jul. 2000 at URL http://www.matter.org.uk/tem/depth_of_field.htm.) Based on Rayleigh's work, depth of focus is defined as: $DOF=k_2 \cdot \lambda_v/NA^2$ as derived for the paraxial case, where $\lambda_v$ is a wavelength in a vacuum and $NA=n \sin \theta$ where n is the index of refraction and $\theta$ is the acceptance angle of the lens.

For consistency in the high NA immersion case, Burn Lin has defined resolution as $W=k_1 \cdot \lambda/\sin \theta$ where $\lambda=\lambda_v/n$. Burn Lin has also shown for immersion optical lithography that $DOF=k_3 \cdot \lambda/\sin^2(\theta/2)$, where $\lambda=(\lambda_v/n)$, $k_3$ is an engineering constant specific to the lithographic process, $\theta$ is the angle used to define NA, and $\lambda$ is the wavelength $(\lambda_v/n)$ in the immersion media. This second form is less ambiguous for high NA and immersion optical lithography.

Optical lithography has been extended to use 193 nanometers for manufacturing patterns, but problems begin to occur below this wavelength. As components and wire dimensions become smaller, the difference in size between the wavelength of the light and the components shrinks. The components and wires at some critical point become the same size or smaller than the wavelength of the light. At this point, the implemented wavelength is no longer capable of printing the chip design with sufficient fidelity. To overcome this problem, shorter light wavelengths must be used; however, new problems arise when using shorter wavelengths. Shorter wavelengths, such as x-rays have been used to achieve smaller linewidths, but the adoption of equipment capable of producing x-rays has been hindered by difficulties associated with manufacturing lenses capable of producing sufficient imaging quality when used with x-rays. These difficulties have led to high lens costs resulting in an expensive migration path from past optical lithography equipment to x-ray optical lithography equipment. Shorter wavelengths are also higher energy wavelengths and therefore high doses of x-rays have a greater potential to damage the solid chip material, especially dielectric. Furthermore, light sensitive compounds in resist only absorb light over a specific range of wavelengths and alternative materials may not always perform as well as necessary. See "Optical Lithography", Craig Friedrich, 1998 at URL http://www-.me.mtu.edu/~microweb/chap1/ch1-4-1.htm.

One way to improve the resolution of optical lithography is to manipulate the numerical aperture variable in Rayleigh's equation or $\sin \theta/2$ in Burn Lin's equations. The maximum attainable value for numerical aperture in conventional dry optical lithography methods is 1; however, it is known from optical microscopy and the work of E. Abbe (1878) that by filling the space between the final lens and the wafer with a high index liquid, light that would otherwise be totally internally reflected is able to pass through the liquid to the wafer surface {Switkes, M., M. Rothschild "Resolution Enhancement of 157 nm Lithography by Liquid Immersion." Optical Microlithography XV (2002): 459.}. It is possible to achieve numerical apertures greater than one and as high as the index of the immersion liquid. The use of a liquid in optical lithography increases the depth of focus by a factor equal to the index of the immersion liquid when NA is held constant, therefore increasing the tolerable error in the process.

Immersion optical lithography permits optical lithography exposure equipment manufacturers to extend the use of their current optical lithography equipment to the next generation of chip design with minimal development cost. With potential numerical apertures of 1.25 or higher and resolutions of 50 nanometers, future chips can be produced using modern immersion optical lithography techniques without making high risk, expensive expenditures on new capital equipment and resist materials required for shorter wavelengths. Because the properties of water make it an ideal immersion liquid for 193 nanometer imaging, and relatively minor modifications to existing equipment are necessary, the transition from dry optical lithography to immersion optical lithography is an economically feasible and low risk decision. New sources of light and new resists are also unnecessary.

The advent of immersion optical lithography has also resulted in numerous additional problems. In order to achieve maximum gains in numerical aperture size, there can be no air between the final lens and the immersion liquid. This requires the final lens element to be immersed in the liquid. Throughout the process, the wafer is secured to a horizontal support surface capable of moving in the x,y, and z directions. During scanning, the final lens element and/or horizontal support surface are moved as the wafer surface is scanned. As the lens moves through the liquid, the motion of the lens translates energy from the lens into the liquid, thus creating ripples, turbulence, and disruption of the liquid environment. Gas and air bubbles may become trapped within the liquid or attach to the lens surface resulting in light scattering and poor quality imaging. Therefore, a need exists for a device capable of minimizing the ripples and turbulences associated with the energy transfer between the motion of the lens and the liquid environment.

SUMMARY OF THE INVENTION

The current invention reduces the turbulence and air bubbles associated with the relative motion of a final lens element in an immersion optical lithography environment. The lens apparatus is coupled to a motion control device capable of adjusting the final lens' angular orientation relative to the wafer. The current invention enables the lens apparatus to move such that the horizontal velocity of a portion of the final lens element relative to the wafer surface substantially minimizes air bubbles, turbulence, and other disruptions of said liquid detrimental to imaging quality as the wafer is scanned.

DETAILED DESCRIPTION OF THE PREFERRED EMBODIMENTS

The invention will be described in detail with reference to the following figures. It will be appreciated that this description and these figures are for illustrative purposes only, and are not intended to limit the scope of the invention. In particular, various descriptions and illustrations of the applicability, use, and advantages of the invention are exemplary only, and do not define the scope of the invention. Accordingly, all questions of scope must be resolved only from claims set forth elsewhere in this disclosure.

Figure 1:
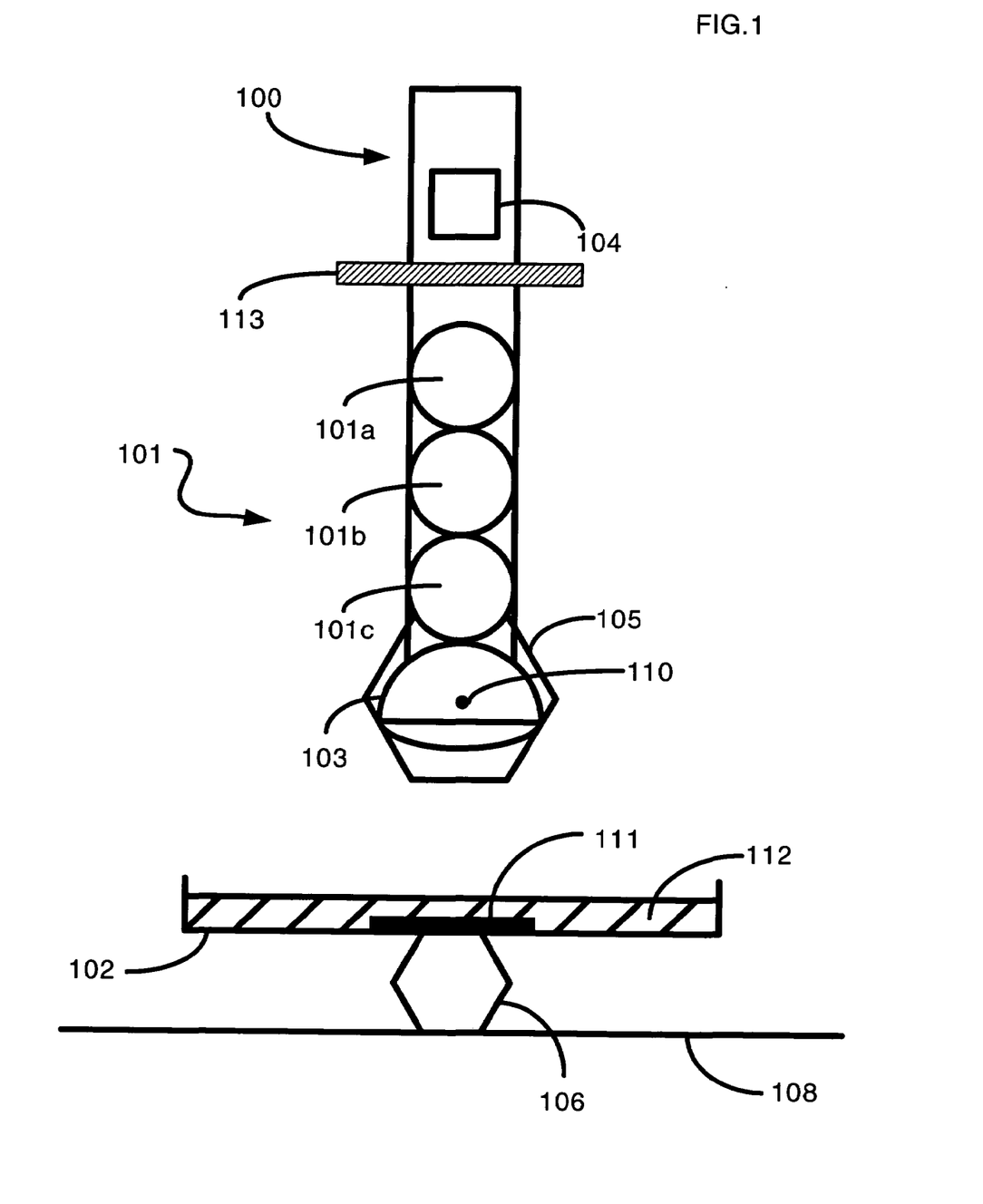
FIG. 1 is a side-view diagram of the immersion optical lithography apparatus.

FIG. 1 is a side-view illustration of an embodiment of the overall invention. A frame 100 serves as a support structure to hold the various related components. Light source 104 is attached to frame 100 and projects the light through a photomask 113 and a lens system 101 having lens elements 101a, 101b, 101c and final lens element 103. Examples of light sources for light source 104 are excimer lasers and mercury arc lamps. Lens system 101a, 101b, 101c and final lens 103 serve to manipulate light projected by light source 104. The lens shape of lenses 101a, 101b, and 101c are shown as having a circular cross section in the illustration but are not limited to this shape and may have curvatures that are spherical or aspheric and concave or convex. Often lenses 101a, 101b, and 101c have a lenticular form. A wafer 111 is secured to a horizontal support surface 102 and is exposed by light source 104 via a scan. A specified pattern is printed on the wafer using a mask 113 through which the light from light source 104 is projected. Horizontal support surface 102 movement is controlled by a first motion control device 106 that controls movement of horizontal support surface 102 in the x, y, and z direction, relative to frame 100. First motion control device 106 is secured to a first stationary surface 108. Wafer 111 is immersed in a liquid 112 such as deionized water or perfluorinated polyethers as part of the optical lithography process.

Final lens element 103 of FIG. 1 is coupled to a second motion control device 105 at one or more coupling points 110. Final lens element 103 then pivots on an axis defined by coupling point 110 when the apparatus is operably running. The pivoting is achieved by control of the second motion control device 105 using a computer controlled shaft, a motor having suitable torque and precision, cams, a gear system, a belt system, or manual control of the operator. The surrounding gaseous environment may consist of one or a combination of the following: air, argon, dry nitrogen, or other inert optically transparent gasses.

Figure 2A:
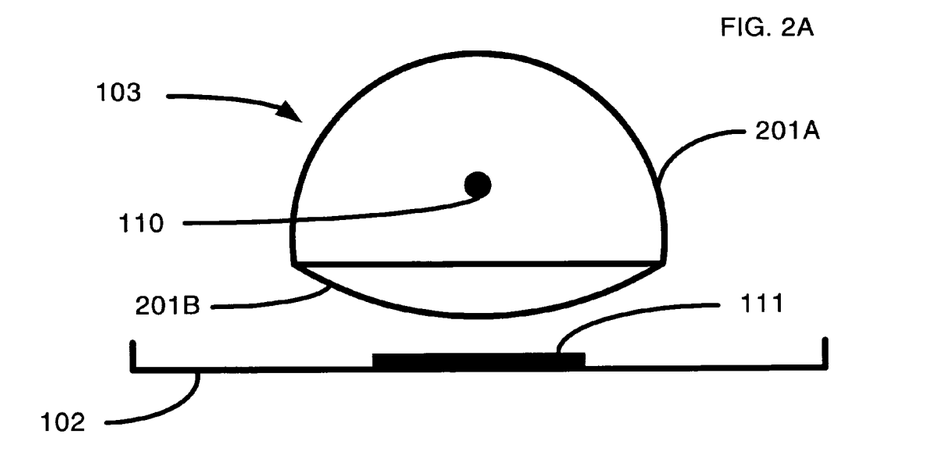
FIG. 2A, 2B, 2C, and 2D are different variations of a final lens element.
Figure 2B:
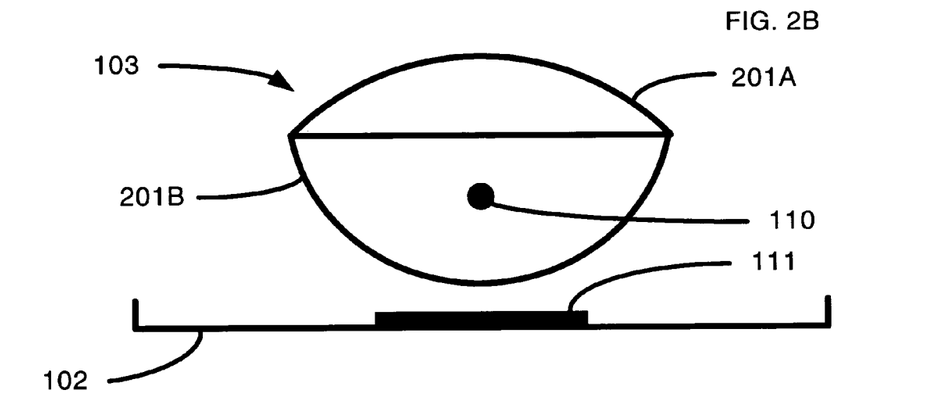
Figure 2C:
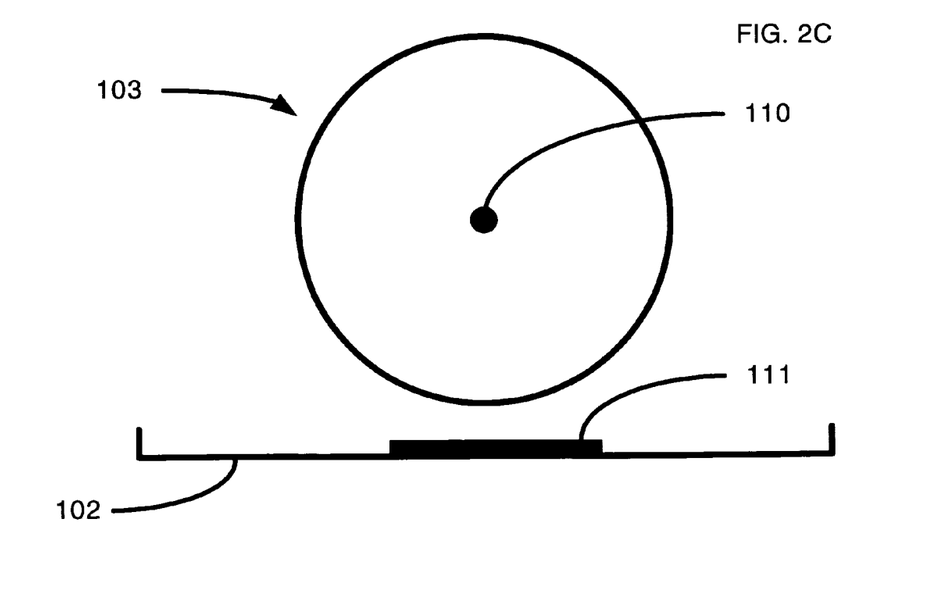
Figure 2D:
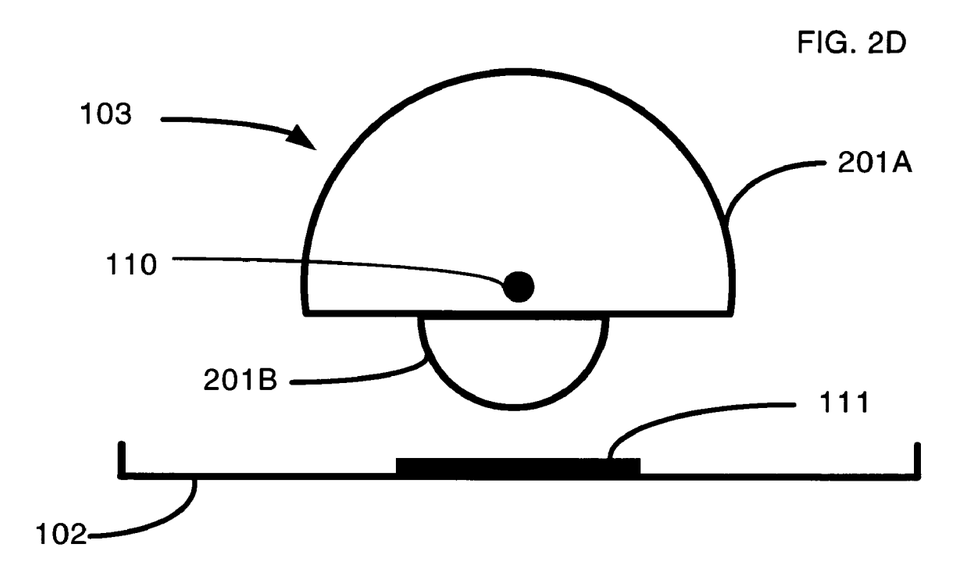

FIGS. 2A, 2B, 2C, and 2D are exemplary variations of final lens element 103 shapes. In FIG. 2A, an embodiment of the lens element 103 has a first curved surface region 201A and a second curved surface region 201B. The horizontal line separating first curved surface region 201A and second curved surface region 201B is used for exemplary purposes only and does not exist in the actual embodiment. The degree of curvature of first curved surface region 201A is greater than that of second curved surface region 201B. Second curved surface region 201B is substantially facing horizontal support surface 102 in this variation of final lens element 103 to effectively scan wafer 111. Final lens element 103 pivots on coupling point 110. In a second variation FIG. 2B, the degree of curvature of first curved surface 201 A is less than that of second curved surface region 201B. Second curved surface region 201B is substantially facing horizontal support surface 102 in this variation to effectively scan wafer 111. In a third exemplary shape of final lens element 103 shown in FIG. 2C, final lens element 103 has a consistent degree of curvature. Final lens element 103 pivots on coupling point 110. Wafer 111 is secured to horizontal support surface 102 and is scanned during the process. FIG. 2D is a fourth exemplary shape of final lens element 103. In FIG. 2D, second curved surface region 201B has a radius significantly smaller than first curved surface region 201 A, as shown.

Figure 3:
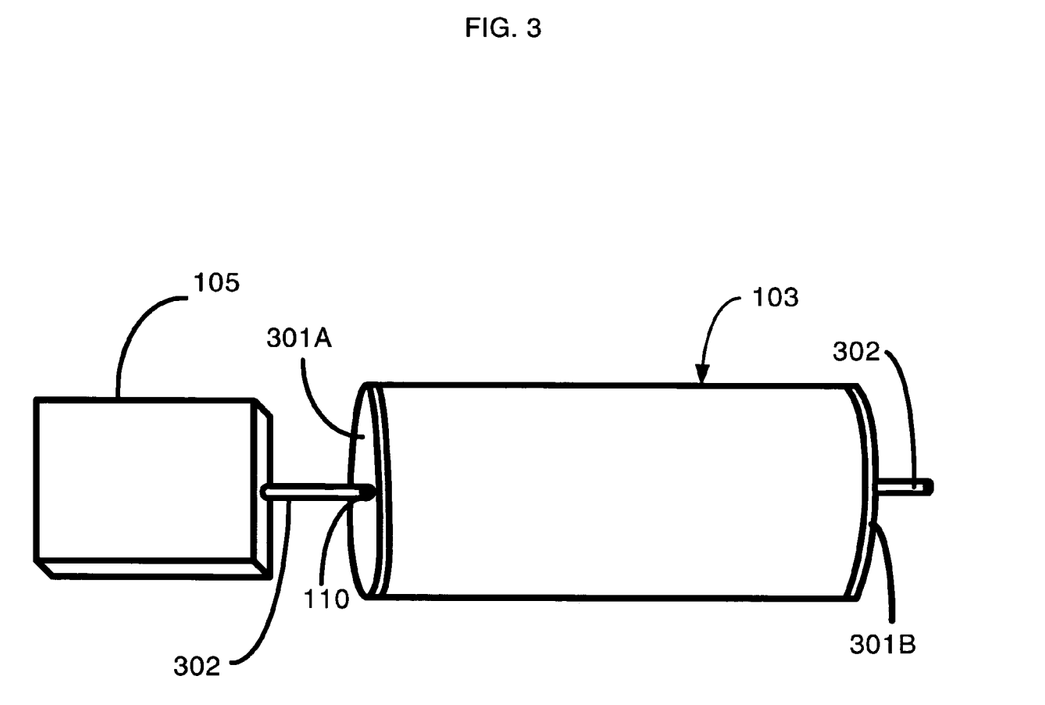
FIG. 3 is a simplified, side-view orthogonal to FIG. 1 of the final lens element and a second motion control device.

FIG. 3 is a simplified, side view of FIG. 1 illustrating final lens element 103 shown as a cylindrical lens, an extension connector 302, and second motion control device 105. Examples of extension connectors include a threaded solid shaft, one or more flexors, or a combination of a solid shaft and an adhesive material. Final lens element 103 contains end covers 301A and 301B which enable extension connector 302 to couple final lens element 103 to second motion control device 105. Final lens element 103 effectively pivots on the axis created by extension connector 302 whose motion is driven by second motion control device 105.

Figure 4A:
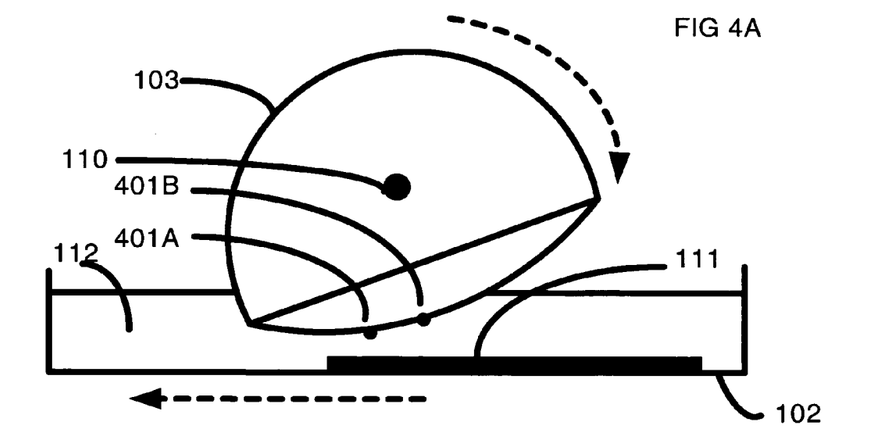
FIGS. 4A, 4B, and 4C are diagrams of the final lens element as it moves during the scan process.
Figure 4B:
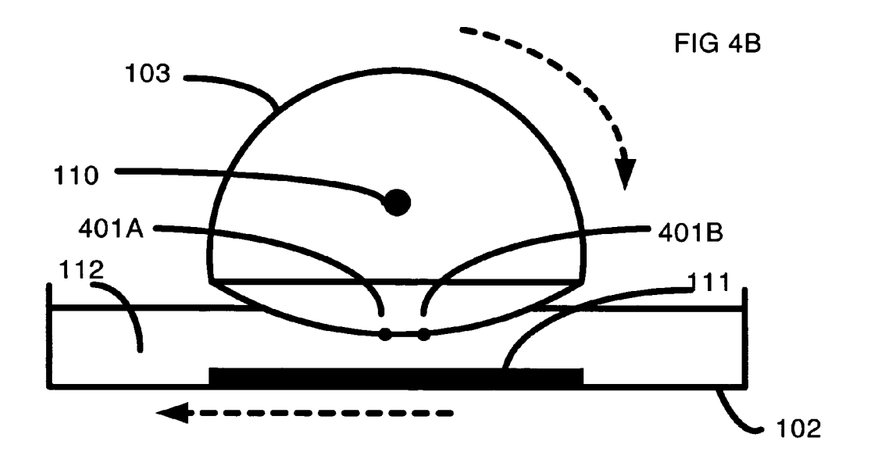
Figure 4C:
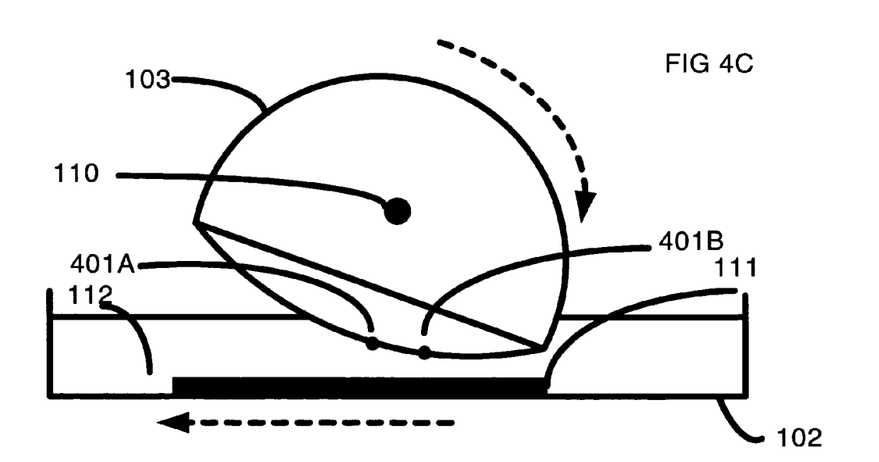

FIGS. 4A, 4B, and 4C illustrate the relative motion of finals lens element 103. In FIG. 4A, final lens element 103 is oriented to a starting position by second motion control device 105 (shown in FIG. 3) coupled to coupling point 110 capable of rotating on an axis. Final lens element 103 is partially submerged in liquid 112 and positioned above wafer 111. Wafer 111 is secured to horizontal support surface 102 capable of moving in an x (horizontal in figures), y (into the paper in figures), and z (vertical in figures) direction under control of first motion control device 106. A proximal lens surface exists on the lens between point 401A and 401B. Proximal lens surface 401A, 401B is that portion of a surface on final lens element 103 nearest the wafer during a scan of the wafer. Note that, as final lens element 103 moves (e.g., pivots about an axis), proximal lens surface 401A, 401B moves along the surface of final lens element 103. As wafer 111 is scanned and synchronous motion of proximal lens surface 401A, 401B and horizontal support surface 102 in the same direction occurs, the velocity of final lens 103 element and/or horizontal support surface 102 are adjusted such that the relative velocity between proximal lens surface 401A, 401B and wafer 111 substantially minimizes air bubbles, turbulence, and other disruptions of said liquid detrimental to imaging quality.

As the scanning of wafer 111 occurs, shown from start FIG. 4A to mid-scan FIG. 4B, final lens element 103 moves such that turbulence and air bubbles associated with the transfer of energy from final lens element 103 moving through liquid 112 are substantially minimized. During this scanning process the velocity of proximal lens surface 401A,401B and/or horizontal support surface 102 are adjusted, keeping the relative velocity between proximal lens surface 401A, 401B and wafer 111 sufficiently low to minimize air bubbles, turbulence, and other disruptions of said liquid detrimental to imaging quality. Horizontal support surface 102 may also move in a z-direction to vary the distance between final lens element 103 and wafer 111 thus optimizing the image focus and image resolution. First motion control device 106 responds to signals from an autofocus device (not shown), moving horizontal surface102 in the z-direction to optimize the image focus. Auto-focus mechanisms moving in the z-direction are well-known in the art. Therefore, three possible adjustment scenarios exist. In a first scenario, horizontal support surface 102 moves at a constant velocity while final lens element 103 moves at a varying angular velocity in a relative motion. In a second scenario, final lens element 103 moves at a constant angular velocity and horizontal support surface 102 moves at a varying velocity in a horizontal direction. In a third scenario, final lens element 103 and horizontal support surface 102 both move at varying velocities such that the relative motion reduces air bubbles, turbulence, and other disruptions of said liquid detrimental to imaging quality enough to keep them from significantly interfering with the imaging. FIG. 4C illustrates final lens element 103 motion nearing the end of the relative motion, where final lens element 103 is in a final position. Depending on the degree of relative motion and the shape of the lens, constant angular velocity and constant horizontal velocity of horizontal support surface 102 may give sufficiently small relative velocity to reduce formation of bubbles and turbulence enough to keep them from interfering with imaging.

Figure 5A:
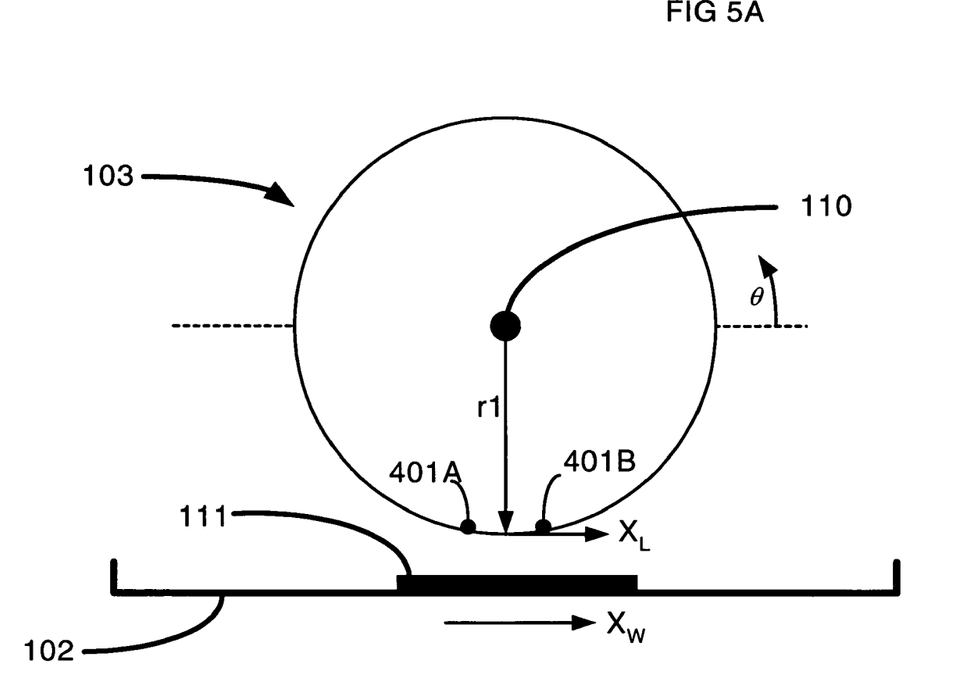
FIG. 5A is a geometric representation of a spherical final lens element and the motion of the final lens element during scanning.

FIG. 5A is an exemplary case of a final lens element 103 being a sphere or cylinder having a cylindrical cross section as depicted in FIG. 2C. As wafer 111 is scanned, a proximal lens surface 401A, 401B of final lens element 103 moves a distance $X_L$ and wafer 111 secured to horizontal support surface 102 moves a distance $X_W$. As the lens moves at an angular velocity $$\frac{d\theta}{dt},$$

the x-component of the velocity vector for proximal lens surface 401A, 401B of final lens element 103 nearest the wafer is $$\frac{dx_L}{dt} = r_1 \frac{d\theta}{dt}.$$

To sufficiently reduce the turbulence and air bubbles associated with this relative motion between final lens element 103 and wafer 111, the x-component of the velocity vector of horizontal support surface 102, $$\frac{dx_W}{dt}$$

should be sufficiently close to $$r_1 \frac{d\theta}{dt}$$

to reduce the turbulence and air bubbles from forming to the degree that they significantly interfere with the imaging. It will be understood that equations hereinafter, for simplicity, show the horizontal component of velocity of the proximal lens surface 401A, 401B being equal to the horizontal velocity of horizontal support surface 102 (upon which wafer 111 is fastened), the invention contemplates any relative velocity difference sufficiently low as to reduce turbulence and bubbles such that the turbulence and bubbles do not significantly interfere with the imaging.

Figure 5B:
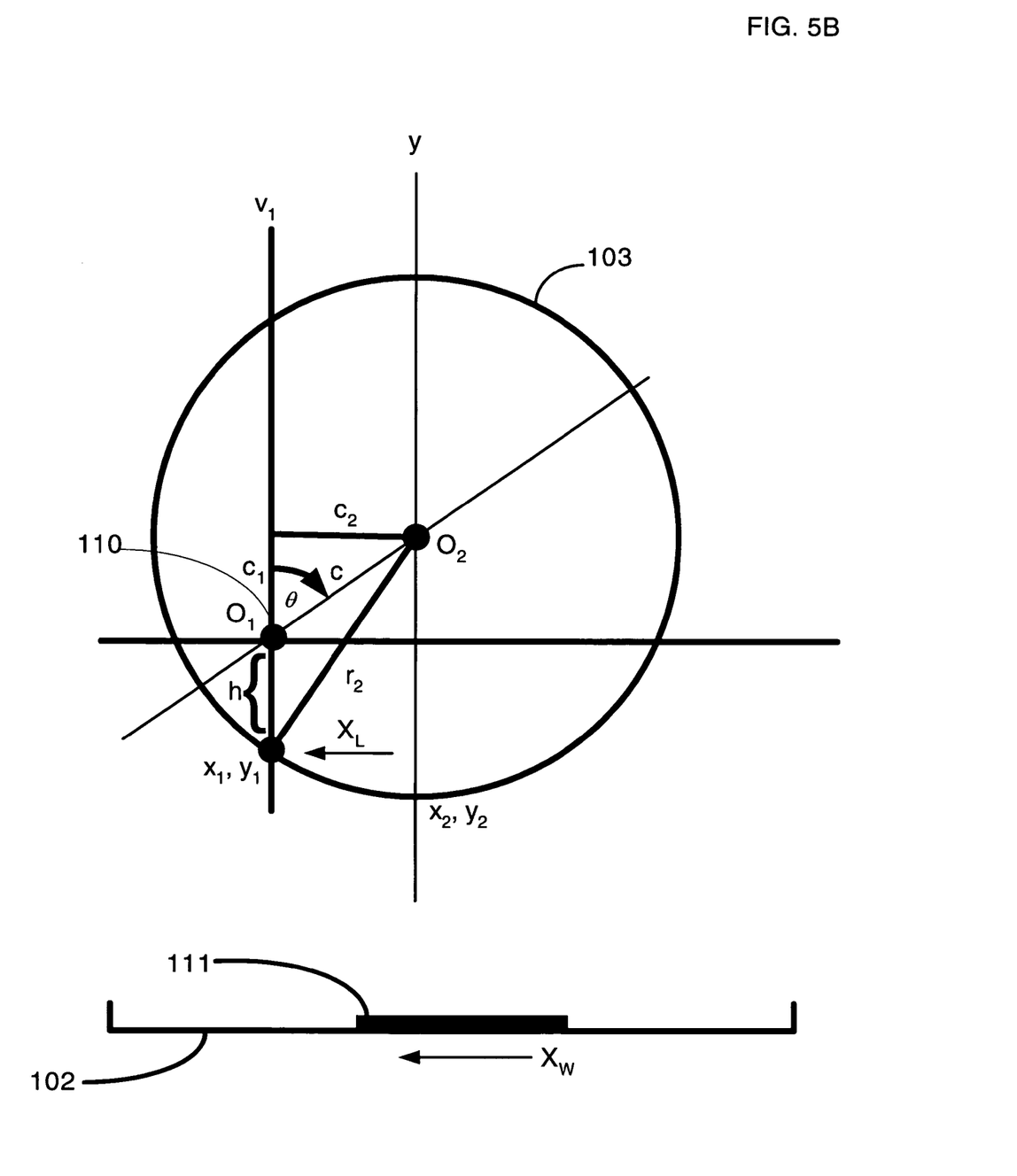
FIG. 5B is a geometric representation of a final lens element and the path the final lens element will follow during scanning.

The mathematical process for x-dimension velocity adjustment of proximal lens surface 401A, 401B of final lens element 103 (as shown in FIG. 2A and FIGS. 4A, 4B, 4C) relative motion and horizontal support surface 102 motion is illustrated here with reference to FIG. 5B. While the following mathematical process is illustrated for exemplary purposes, and other mathematical processes that produce similar or the same end result are contemplated, this discussion is not deemed to be restrictive as to the scope and spirit of the invention. θ is an angular rotation of final lens element 103 about coupling point 110 ($O_1$), defined positive when moving in a clockwise direction and thus for velocity of proximal lens surface 401A, 401B of final lens element 103 in the x-direction. $O_1$ is the center of a first spherical or cylindrical surface (as shown in 5A., not shown in 5B) with radius $r_1$. $O_2$ is the center of a second spherical or cylindrical surface with radius $r_2$.

$$\frac{dx_L}{dt}$$

is the x-direction velocity component of proximal lens surface 401A, 401B on final lens element 103 as it moves in the x-direction (horizontal) as shown in FIG. 5B. The distance h is the radius created between center $O_1$ and point $x_1, y_1$ on circle with center $O_2$.

$$\frac{dx_L}{dt}$$

can be computed by first noting that $$\frac{dx_L}{dt} = h\frac{d\theta}{dt}$$

for proximal lens surface 401A, 401B. Note that, in the present example, h is a function of angle theta, and therefore changes as final lens element 103 is rotated.

$(h+c_1)^2+(c_2)^2=r_2^2$, and then substituting for $c_1$ and $c_2$:

$(h+c\cos\theta)^2+(c\sin\theta)^2=r_2^2$ and, therefore:

$$h = -c\cos\theta + \sqrt{r_2^2 - c^2\sin^2\theta} \quad \text{where } r_2 > c \qquad (1)$$

The distance h represents the z-direction (vertical) distance between coupling point 110 (i.e., $O_1$ is coupled to coupling point 110) of final lens element 103 and the point on final lens element 103 surface intersecting with ray $v_1$ (i.e., proximal lens surface 401A, 401B), which is in the immersed portion of final lens element 103 through which light from light source 104 exposes wafer 111.

During a portion of the scan, wafer 111 travels a distance $X_W$ in time t. Proximal lens surface 401A, 401B of final lens element 103 and wafer 111 move in the same direction at a small enough relative velocity so as to reduce or eliminate turbulence and/or bubble formation in liquid 112: (equation (2) is shown as an "equality", but it will be understood that the invention contemplates any relative velocity between proximal surface 401A, 401B and horizontal support surface 102 low enough to reduce turbulence and bubbles to the degree that the turbulence and bubbles do not significantly interfere with the imaging).

$$\frac{dx_W}{dt} = h\frac{d\theta}{dt} \qquad (2)$$

While the previous mathematical explanations have been computed using the exemplary case of final lens element 103 shape as shown in FIG. 2A, the apparatus and motion are not limited to this example shape. Other lens shapes may be implemented and are within the scope and spirit of the invention.

Figure 6:
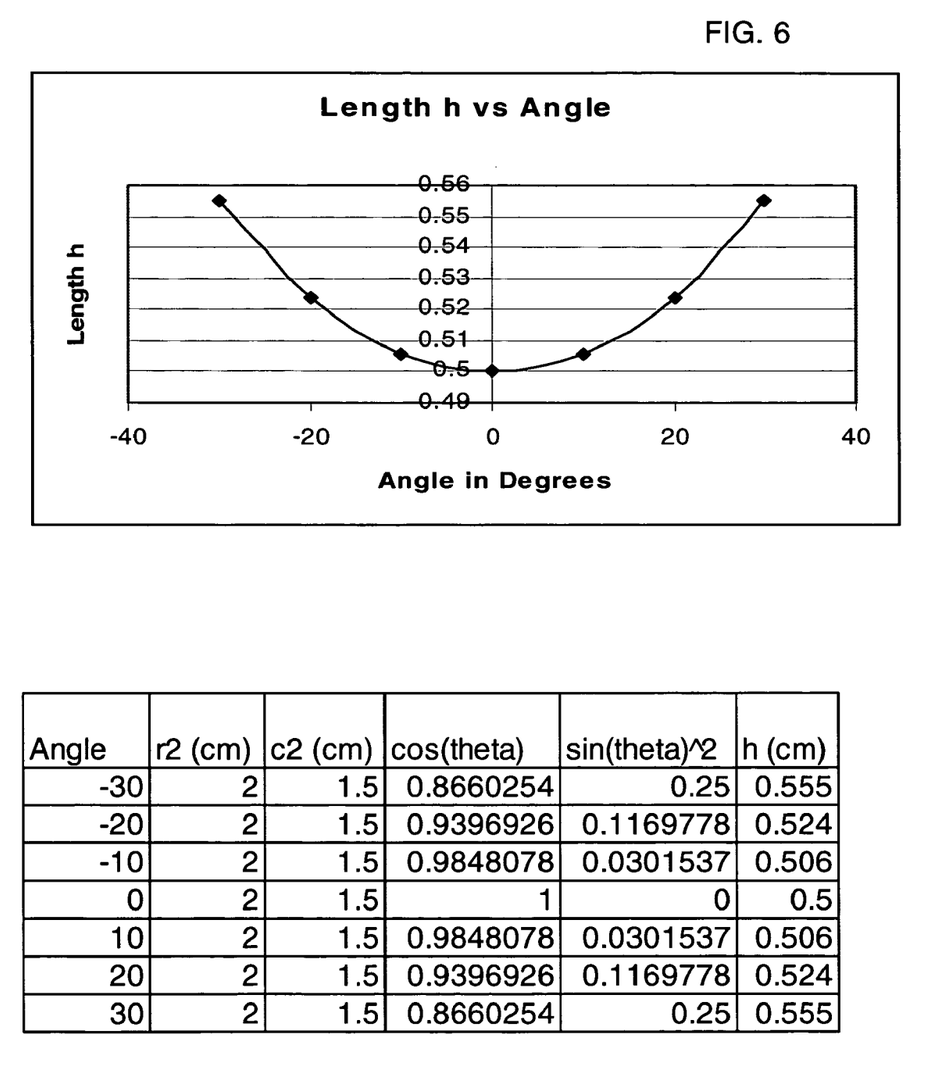
FIG. 6 is a spreadsheet portion and resultant x–y plot from the spreadsheet portion showing the relationship between angle θ and length h.

FIG. 6 is a plot of the length of h versus the size of the angle created by the relative motion of the final lens element 103 according to the embodiment depicted in FIG. 2A, using equation (1) above with exemplary parameters $R_2=2$ and $C=1.5$, and letting $\theta$ vary from $-30$ degrees to $+30$ degrees. As final lens element 103 moves in a relative motion from a first position as shown in FIG. 4A to a mid-scan position as shown in FIG. 4B, and theta decreases, h decreases as well, reducing a horizontal velocity of proximal lens surface 401A, 401B. As final lens element 103 continues to move in a relative motion from the mid-scan position as shown in FIG. 4B to a final position as shown in FIG. 4C, h increases, with a proportional increase in horizontal velocity of proximal lens surface 401A, 401B. As described earlier, the horizontal velocity of proximal lens surface 401A, 401B can be maintained constant by changing the angular velocity versus theta to compensate for the changing length, h. As described earlier, the angular velocity of final lens element 103 can be maintained constant and first motion control device 106 controls horizontal velocity of horizontal support surface 102 at a varying rate to account for the varying horizontal velocity of proximal lens surface 401A, 401B. The current invention contemplates varying motions of both horizontal support surface 102 and angular velocity of final lens element 103 as an alternative mechanism to maintain the relative velocity of proximal lens surface 401A, 401B substantially the same as the horizontal velocity of horizontal support surface 102. Alternatively, if turbulence and bubbles are minimal when the angular velocity of final lens element 103 is constant and the horizontal velocity of horizontal support surface 102 is constant, such constant angular velocity and horizontal velocity is acceptable as an embodiment of the present invention.

Figure 7:
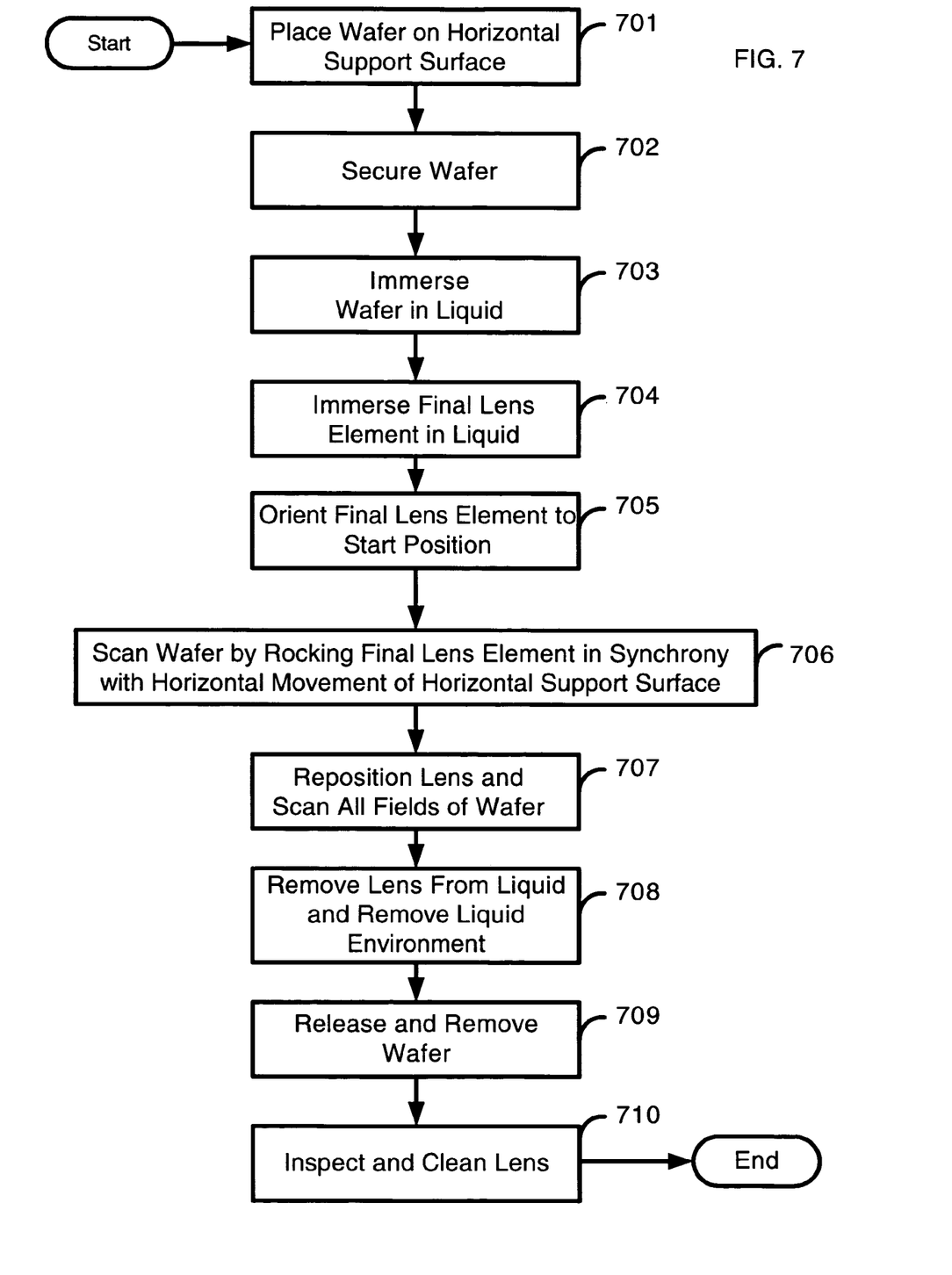
FIG. 7 is a flow chart of the optical lithography process.

FIG. 7 is an illustration of the method steps comprising the optical lithography process. In step 701, a semiconductor wafer is placed on a horizontal support surface capable of moving in the x, y, and z dimensions. In step 702, the wafer is secured to the horizontal support surface such that the horizontal and vertical movement of the wafer and the horizontal support surface are identical. Step 703 involves immersing the wafer into a liquid by creating a reservoir of liquid on the horizontal support surface. The liquid generally is deionized water or perfluorinated polyethers. The final lens element is immersed in the liquid environment in step 704 near a top surface of the wafer by lowering the final lens element into the liquid, raising the horizontal support surface towards the final lens element, or both. The top surface of the wafer is the surface of the wafer to be scanned which faces the final lens element when resting on the horizontal support surface. In step 705 the final lens element is oriented to a start position by a motion control device coupled to the final lens element. A computer system, a motor or motors having suitable torque and precision, a cam system, a gear system, or manual control of an operator, controls the movement of the final lens element.

Step 706 involves scanning the wafer by moving the final lens element in synchrony with the horizontal support surface, thus substantially reducing the turbulences and air bubbles associated with the movement of the final lens element through the liquid. Adjustments to the velocity of the final lens and horizontal support surface velocity are made during the process to ensure the relative velocity between the wafer and proximal lens surface is substantially small. The proper adjustment can be made using a computer system, one or more precision motors, a cam system, or manual control of the operator.

In step 707, the process of scanning is repeated for each field of the wafer until the necessary scanning of the wafer is complete. After each field is scanned, the final lens element may be lifted out of the liquid and repositioned to the next field or the final element may be repositioned without removing the final lens element from the liquid. At the beginning of each new scan, the final lens element and mask are re-oriented back to the start position and the process is repeated. After scanning a field on the wafer, the final lens element is at an end position which may also become the start position of a scan in the opposite direction for the next new field. When all scanning is complete, the final lens element is removed from the liquid environment and the liquid environment is eliminated by suction or draining off of the liquid in step 708. The wafer is then released and removed in step 709. In step 710, the final lens element may be cleaned by various methods including but not limited to a cloth, air pressure, or a liquid cleaner.

What is claimed is:

1. An apparatus capable of projecting light comprising:
   a frame;
   a lens system disposed within said frame;
   a horizontal support surface generally associated with said frame capable of holding a semiconductor wafer;
   a first motion control device capable of producing an x, y, and z dimensional movement between said horizontal support surface relative to said frame;
   a final lens element in said lens system, positioned near a first end of said frame, said final lens element having a final lens element surface, said final lens element surface capable of being positioned near said semiconductor wafer;
   wherein said final lens element is coupled to a second motion control device capable of moving said final lens element relative to said frame; and
   a light source positioned near a second end of said frame, said light source capable of passing light through said lens system;
   wherein said final lens element is capable of movement relative to said frame;
   wherein a proximal lens surface on said final lens element surface is partially or totally submerged in a liquid when in an operable position; and
   wherein a relative horizontal velocity between said proximal lens surface and said horizontal support surface is small enough to ensure that turbulence and air bubbles created in said liquid by said relative horizontal velocity do not cause significant degradation of an imaging quality of the apparatus.

2. The apparatus of claim 1 wherein said final lens element is capable of pivotal movement about an axis.

3. The apparatus of claim 1 wherein said final lens element is capable of pivotal movement about a single axis.

4. The apparatus of claim 1 wherein one or more coupling points are coupled to said final lens element by extension connectors.

5. The apparatus of claim 1 wherein said first motion control device is selected from one or more of the group consisting of a computer system, a motor, a belt system, a threaded or keyed shaft, a gear system, a cam mechanism, and a manual mechanism controlled by an operator.

6. The apparatus of claim 1 wherein said final lens element rotates about an axis coupled to said frame at a constant angular velocity, and a horizontal velocity of said horizontal support surface relative to said frame is constant.

7. The apparatus of claim 1 wherein said final lens element rotates about an axis coupled to said frame at a variable angular velocity, and a horizontal velocity of said horizontal support surface relative to said frame is constant.

8. The apparatus of claim 1 wherein said final lens element rotates about an axis coupled to said frame at a constant angular velocity, and a horizontal velocity of said horizontal support surface relative to said frame is variable.

9. The apparatus of claim 1 wherein said final lens element rotates about an axis coupled to said frame at a variable angular velocity, and a horizontal velocity of said horizontal support surface relative to said frame is variable.

10. The apparatus of claim 1 wherein said liquid is selected from the group consisting of:
    deionized water,
    perfluorinated polyethers.

11. The apparatus of claim 1 wherein said apparatus exists in a closed environment where an atmosphere of said closed environment is primarily composed of one or more elements or compositions selected from the group consisting of:
    argon,
    dry nitrogen, and
    air.

12. The apparatus of claim 1 wherein said apparatus exists in a closed environment where an atmosphere of said closed environment comprises one or more inert optically transparent gasses.

13. The apparatus of claim 1 wherein a cross section of said final lens element is substantially cylindrical.

14. The apparatus of claim 1 wherein said final lens element comprises a first curved surface region and a second curved surface region where a degree of curvature of said first curved surface region is greater than the degree of curvature of said second curved surface region and said second curved surface region substantially faces said horizontal support surface.

15. The apparatus of claim 1 wherein said final lens element further comprises a first curved surface region and a second curved surface region where the degree of curvature of said first curved surface region is less than the degree of curvature of said second curved surface region and said second curved surface region substantially faces said horizontal support surface.

16. The apparatus of claim 1 wherein a cross section of said final lens is cylindrical.

* * * * *